United States Patent [19]
DeMeester et al.

[11] Patent Number: 4,912,413
[45] Date of Patent: Mar. 27, 1990

[54] CONJUGATE SYMMETRY MAGNETIC RESONANCE IMAGING

[75] Inventors: Gordon D. DeMeester, Wickliffe; John L. Patrick, Solon; G. Neil Holland, Chagrin Falls, all of Ohio

[73] Assignee: Picker International, Inc., Highland Hts., Ohio

[21] Appl. No.: 260,402

[22] Filed: Oct. 20, 1988

Related U.S. Application Data

[63] Continuation-in-part of Ser. No. 85,956, Aug. 14, 1987, Pat. No. 4,780,675.

[51] Int. Cl.$^4$ ............................................. G01R 33/20
[52] U.S. Cl. ....................................... 324/312; 324/309
[58] Field of Search ............... 324/300, 307, 309, 312; 364/571, 726

[56] References Cited

U.S. PATENT DOCUMENTS

| | | | |
|---|---|---|---|
| 4,684,891 | 8/1987 | Feinberg | 324/307 |
| 4,689,567 | 8/1987 | Maudsley | 324/309 |
| 4,694,251 | 9/1987 | Yoshitome et al. | 324/309 |
| 4,728,893 | 3/1988 | Feinberg | 324/309 |
| 4,733,188 | 3/1988 | Sekihara et al. | 324/312 |
| 4,740,748 | 4/1988 | Rzedzian | 324/309 |
| 4,745,364 | 5/1988 | Hatanaka | 324/309 |
| 4,748,410 | 5/1988 | Macovski | 324/309 |
| 4,818,942 | 4/1989 | Rzedzian | 324/309 |

OTHER PUBLICATIONS

"Faster MR Imaging Imaging with Half the Data" by Margosian et al, Health Care Instrumentation, vol. 1, No. 6, 1986, pp. 195-197.

"Faster MR Imaging-Imaging with Half the Data" by Paul Margosian, Society of Magnetic Resonance in Medicine, 4th Annual Meeting, Aug. 19-23, 1986, London, pp. 1024-1025.

"Field Inhomogeneity Correction and Data Processing for Spectroscopic Imaging" by Madusley et al., Magnetic Resonance in Medicine, 2, 1985, pp. 218-233.

"Direct Fourier Transform NMR Tomography with Modified Kumar-Welti-Ernst (MKWE) Method" by Song et al., IEEE Transactions on Nuclear Science, vol. NS-29, No. 1, Feb. 1982.

"Magnetic Field Measurement by NMR Imaging" by Maudsley et al., The Institute of Physics, 1982, pp. 216-220.

"MR Images from on Quarter of the Data: Combination of Half Fourier Methods with a Linear Recursive Data Extrapolation" by P. Margosian, Book of Abstracts, Society of Magnetic Resonance in Medicine, Annual Meeting, Aug. 17-21, 1987, NY.

"A New Method of Measuring Static Field Distribution Using Modified Fourier NMR Imaging" by Sekihara et al., The Institute of Physics, 1985, pp. 224-227.

"RARE Imaging: A Fast Imaging Method for Clinical MR" by Henning et al., Mag. Res. in Medicine, 3, pp. 823-833 (1986).

"Phase Encoded, Rapid, Multiple Echo (PERME) Nuclear Magnetic Resonance Imaging" by Lawton, Aug. 1985.

"Exploiting the Stimulated Echo in NMR Imaging" by Sattin for NVR, Picker Clinical Science Center, vol. 2, No. 1, Feb. 1987, pp. 18-21.

*Primary Examiner*—Michael J. Tokar
*Attorney, Agent, or Firm*—Fay, Sharpe, Beall, Fagan, Minnich & McKee

[57] ABSTRACT

An incomplete set of magnetic resonance image data is collected and stored in a view memory (40). The incomplete set of image data includes a central or first set of data values (42, 42') and half of the remaining data values (44, 44'). A symmetric data set which fills the other remaining half (46, 46') of the data values is generated (90) by determining the complex conjugate of each value of the incomplete data set. The incomplete and symmetric data sets are Fourier transformed (64, 94) to create first and second images $f_1(x,y)$ and $f_2(x,y)$. The first and second images are multiplied (100, 104) by conjugately symmetric phase correction values $e^{i\phi(x,y)}$ and $e^{-i\phi(x,y)}$ from a phase correction memory (70) to produce phase corrected images. The first and second phase corrected image representations are summed (110) and displayed (114). The phase correction values $\phi(x,y)$ may be derived (68) from the first image or from a phase image (86) derived (80, 82, 84) from a central or other portion of the acquired incomplete image data set.

19 Claims, 3 Drawing Sheets

CONJUGATE SYMMETRY MAGNETIC RESONANCE IMAGING

This application is a continuation of U.S. patent application Ser. No. 085,956, filed 8/14/87, U.S. Pat. No. 4,780,675.

BACKGROUND OF THE INVENTION

The present invention relates to the magnetic resonance art. It finds particular application in conjunction with Fourier transform imaging and will be described with particular reference thereto. It is to be appreciated, however, that the present invention may also find application in other imaging and spectroscopy techniques in which only a partial or incomplete data set is available.

Heretofore, medical diagnostic magnetic resonance imaging has included the sequential pulsing of radio frequency signals and magnetic field gradients across a region to be imaged. In two dimensional imaging, a patient is disposed in a region of interest in a substantially uniform main magnetic field. An RF excitation pulse is applied as a slice select gradient is applied across the field to select a slice or other region of the patient to be imaged. A phase encode gradient is applied along one of the axes of the selected slice to encode material with a selected phase encoding. In each repetition of the pulse sequence, the phase encode gradient is stepped in regular intervals from a negative maximum phase encode gradient through a zero phase encode gradient to a positive maximum phase encode gradient. Theoretically, the pair of views corresponding to positive and negative phase encode gradients have a symmetric relationship. However, in practice the symmetry relationship is rendered unpredictable by sequence and field dependent phase considerations. In order to overcome these difficulties, conventionally both positive and negative phase encode views are collected in order to form a phase independent magnitude image.

Magnetization manipulation pulses are applied to cause a magnetic resonance echo. During the echo following each pulse sequence, one set of data points, generally termed a view or step, is sampled. The data points within each view correspond to a preselected range of frequencies $f_o \pm \Delta f$, where $f_o$ is the frequency of the center data value of the view. For the zero phase encoding view, a datum frequency $f_o + \Delta f_1$ is related to that of $f_o - \Delta f_1$. The data values for a positive phase encode view corresponding to a frequency $f_o + \Delta f_1$ are also related to the corresponding negative phase encode view at frequency $f_o - \Delta f_1$ by conjugate symmetry. In this manner, each data point in a full data set, sometimes referred to as k space, is related to another point by the underlying property of conjugate symmetry. The complete set of views is operated on by a two dimensional inverse Fourier transform to derive an image representation.

Others have reconstructed images utilizing only half a set of views, i.e. only the positive views or only the negative views. In one such half data reconstruction, about eight additional views were collected adjacent the zero or minimum phase encoding. The sixteen central views about the zero phase encoding were utilized to derive a phase map. The acquired data was filtered and the data set was completed by filling with zeros. The Fourier transform of this data set was then phase corrected by the phase map to yield the final reconstruction. However, this technique produced less than satisfactory images which were particularly sensitive to artifacts caused by motioninduced errors in phase.

The present invention provides a new and improved technique for reconstructing images with less than a full set of data.

SUMMARY OF THE INVENTION

In accordance with the present invention, a method of magnetic resonance imaging is provided. Magnetic resonance data which includes centrally encoded data values and half of the remaining data values is acquired. Phase correction values are generated from the acquired magnetic resonance data. Symmetric data is generated from the acquired magnetic resonance data. The acquired magnetic resonance and symmetric data are Fourier transformed. The Fourier transformed acquired and symmetric data are phase corrected in accordance with the phase correction values and combined to produce an image representation.

In accordance with one embodiment of the present invention, the phase correction values are generated only from the centrally encoded data values. In accordance with another embodiment of the invention, the phase correction values are generated from the centrally encoded and acquired half of the remaining data values.

In accordance with a more limited aspect of the present invention, an incomplete magnetic resonance data set is acquired in which a peak data value is off set in one of the phase encode and frequency directions. A phase correction data set is generated by filtering at least a portion of the incomplete data set to create a filtered data set which is completed with zeroes. The completed, filtered data set is Fourier transformed to create first image values. A symmetric data set is created from the acquired incomplete data set with a conjugate symmetry relationship. The symmetric data set is Fourier transformed to create symmetric image values. The relative phase of the first and symmetric image values is adjusted in accordance with the phase correction values. The relative phase corrected acquired and symmetric image values are combined to create a complex resultant image whose real, imaginary, or magnitude component is displayable.

In accordance with another aspect of the present invention, a magnetic resonance imaging apparatus is provided. A magnetic resonance data means acquires an incomplete data set. A phase correction data generating means generates phase correction data from data of the incomplete data set. A complex symmetry means generates a symmetric data set from complex conjugate values of the incomplete data set. A Fourier transform means transforms the incomplete and symmetric data sets to create first and second image representations. A phase correcting means corrects the relative phase of the first and second image representations in accordance with the phase correction data. A combining means combines the relative phase corrected first and second image representations to create a resultant image.

One advantage of the present invention is that it can be used to reduce the data collection time by reducing the number of phase encoded views.

Another advantage of the present invention is an improved NMR sequence capability by selecting slightly more than half the echo to sample.

Another advantage of the present invention is that it improves the resultant image.

Still further advantages will become apparent to those of ordinary skill in the art upon reading and understanding the following detailed description.

BRIEF DESCRIPTION OF THE DRAWINGS

The invention may take form in various steps and arrangements of steps and in various components and arrangements of components. The drawings are only for purposes of illustrating a preferred embodiment and are not to be construed as limiting the invention.

DETAILED DESCRIPTION OF THE PREFERRED EMBODIMENT

Figure 1A:
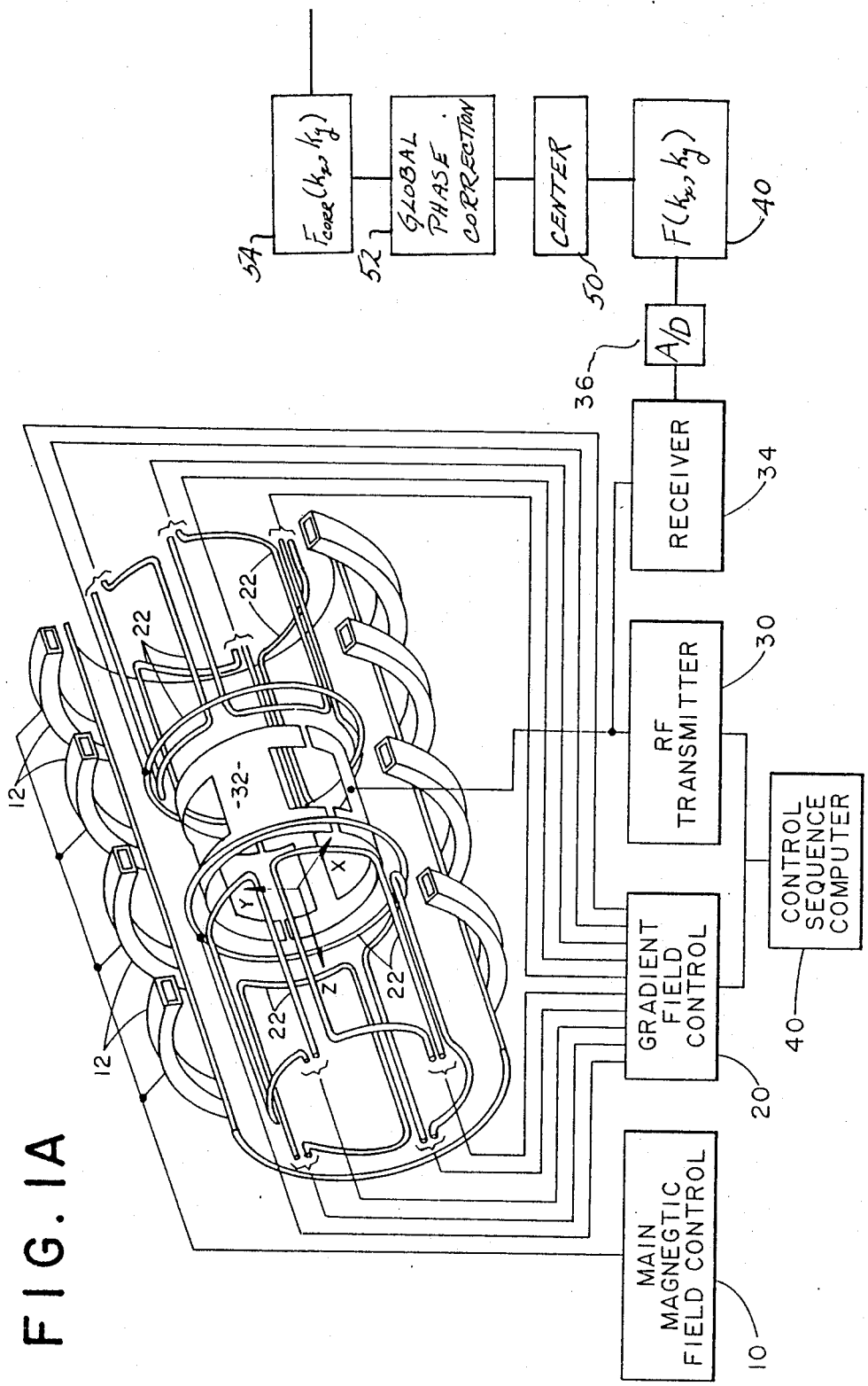
FIG. 1A and FIG. 1B are a two part diagrammatic illustration of a magnetic resonance imaging apparatus in accordance with the present invention.
Figure 1B:
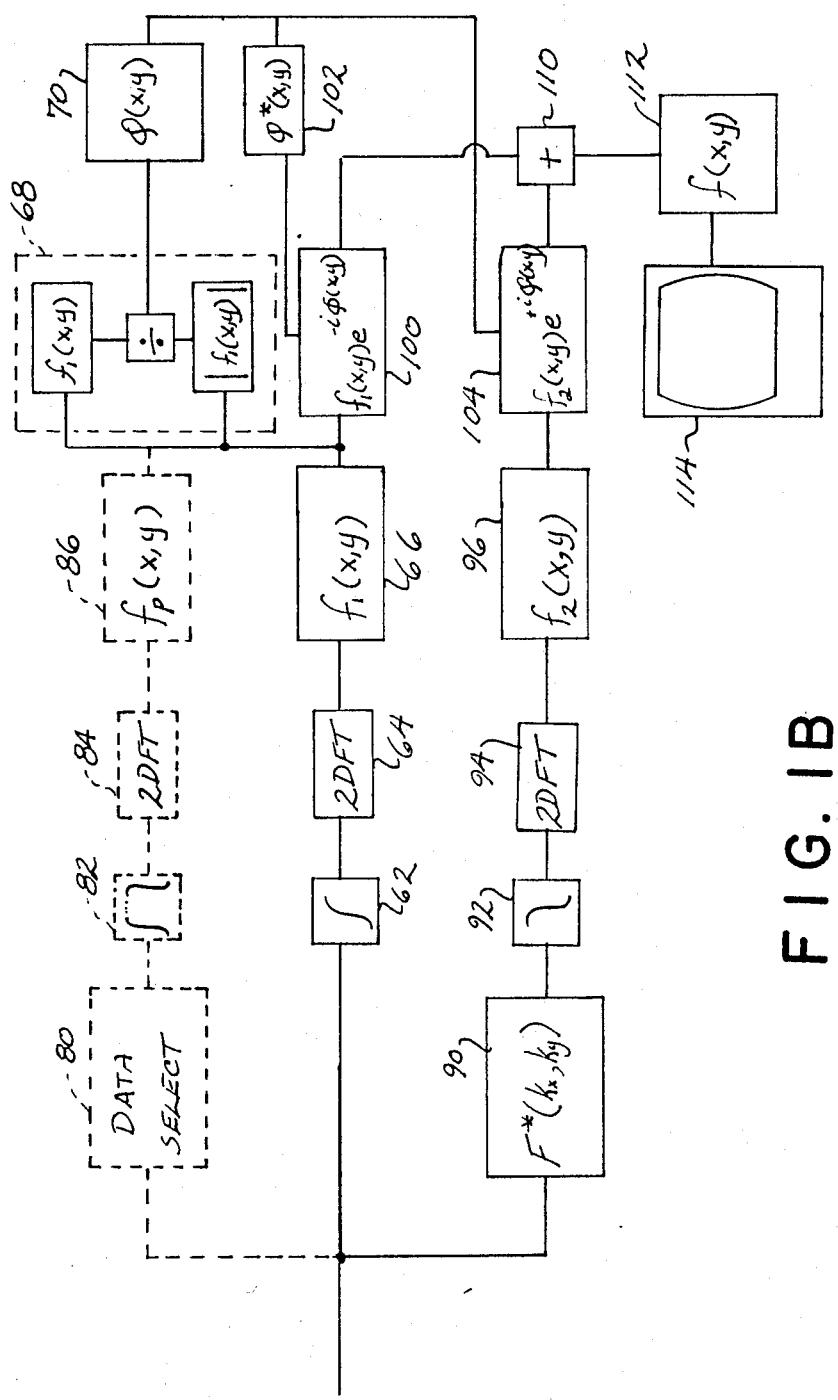

With reference to FIGURES IA and IB, nuclear spin of hydrogen in an image region of a magnetic resonance imaging apparatus are excited to magnetic resonance. More specifically, a main magnetic field means, including a main magnetic field controller 10 and a plurality of electromagnets 12, generates a substantially uniform, main magnetic field through the image region. In a superconducting magnet, the controller 10 is only used to ramp up to field or down. A gradient field control means 20 selectively controls the application of gradient fields across the main magnetic field by gradient field coils 22. By selectively applying current pulses to appropriate ones of the gradient field coils, slice select, phase encode, and read gradients are selectively applied along mutually orthogonal axes. The slice select gradients define an image slice or region and the phase encode and read gradients encode the magnetic resonance along mutually orthogonal axes within the slice.

A transmitter 30 selectively applies radio frequency pulses to RF coils 32 to excite dipoles in the image region to magnetic resonance and to manipulate or orient the magnetization of the resonating dipoles. Magnetic resonance signals generated by the resonating dipoles, particularly when the magnetization is refocused into an echo, are received by the RF coils 32. A radio frequency receiver 34 demodulates the received radio frequency signals to a bandwidth of $f_o \pm \Delta f$, where the center frequency f of the bandwidth or spectrum $\pm \Delta f$ is preferably zero.

The received magnetic resonance signals are quadrature detected then digitized by an analog-to-digital converter 36 with the digitized signals from each echo commonly being denoted as a view or line of data. A timing and control means 38 controls the timing and application of the gradient and radio frequency pulses to perform spin echo, gradient echo, inversion recovery, and other imaging sequences as are well known in the art.

In a single slice spin echo imaging sequence, for example, the gradient field control means 20 applies a slice select gradient to change the magnetic field strength as a function of position along the main magnetic field. The transmitter 20 generates a radio frequency magnetic resonance excitation pulse to excite magnetic resonance between the spin system and the RF field. Thereafter, the spin system relaxes, during which only the magnetization is away from the main magnetic field axis. The gradient field control means encodes the resonating data along mutually orthogonal axes within the slice by applying slice select and phase encode gradient pulses. The radio frequency transmitter 30 then applies an inversion pulse to cause diverging or dephasing magnetization vectors of the excited resonance to converge and form an echo. The magnetic resonance signal generated during the echo is received by the receiver 34 which filters out frequency components outside of the selected slice and heterodynes the received data to the bandwidth $\pm \Delta f$ about the preselected central frequency $f_o$. The data is digitized to form a first view or line of data. The imaging sequence is repeated with different phase encode gradients to generate additional lines of acquired data $F(k_x, k_y)$ which are stored in an acquired view memory 40. Although the preferred embodiment is described in terms of single slice imaging, it is to be appreciated that the invention is also applicable to volume imaging, multi-slice imaging, and the like.

Figure 2:
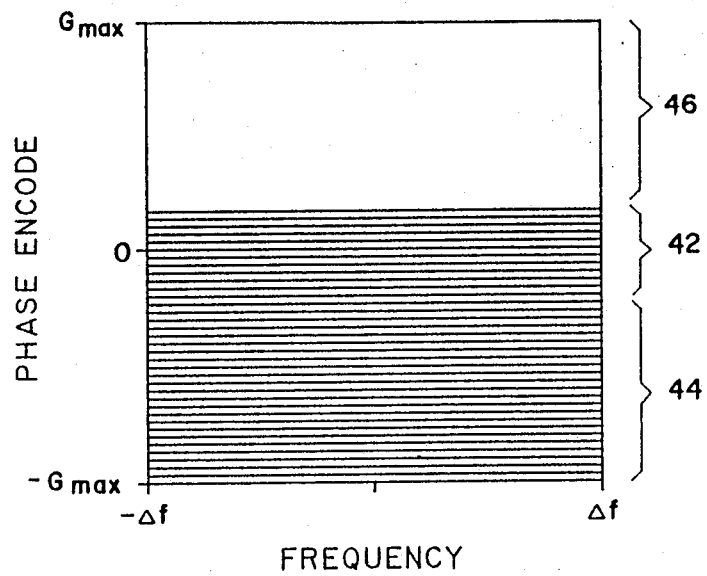
FIG. 2 is a graphic representation to assist in conceptualizing synthesizing additional views by conjugate symmetry; and, FIG. 3 is a graphic representation to assist in conceptualizing frequency spectrum data expansion by conjugate symmetry.

With reference to FIG. 2, each view is commonly identified by the value of the phase encoding gradient with which the resonance data is encoded. Commonly, a preselected number of views, e.g. 256 views, corresponding to phase encode gradients that vary in like steps from $-G_{max}$ to $+G_{max}$ are generated by repeating the imaging sequence with different phase encode gradients. Each view or data line is frequency encoded by the read gradient pulse and includes a plurality of frequency components. The frequency component in the center of each view should be $f_o$, those at one extreme $f_o - \Delta f$ and those at the other extreme $f_o + \Delta f$. A datum value at a frequency $f_o + \Delta f_1$ of a positive phase encode view is related by conjugate symmetry to a datum value at a frequency $f_o - \Delta f_1$ of the corresponding negative phase encode view. For the zero phase encode view, the datum values are symmetric about $f_o$.

In the preferred embodiment, an incomplete set of data is acquired. The imaging sequence is repeated to collect data over a contiguous phase encoded central set of views 42 surrounding the zero or minimum phase encode gradient. A first magnetic resonance data set 44 is acquired for half of the remaining views, preferably the contiguous views between the central views 42 and either $-G_{max}$ or $+G_{max}$. Of course, the acquired half of the remaining views need not be contiguous side of views. For example, odd views can be collected on one side of the center and even views on the other side. Alternately, groups with a smaller plurality of discontinuous views may be collected on one side. A data set for the other half of the remaining views, e.g. the side views 46 between the central views and the other of $\pm G_{max}$ are not acquired. Rather, as described below, a symmetric data set is synthesized from the acquired data 42, 44 using the symmetry properties of the data.

Figure 3:
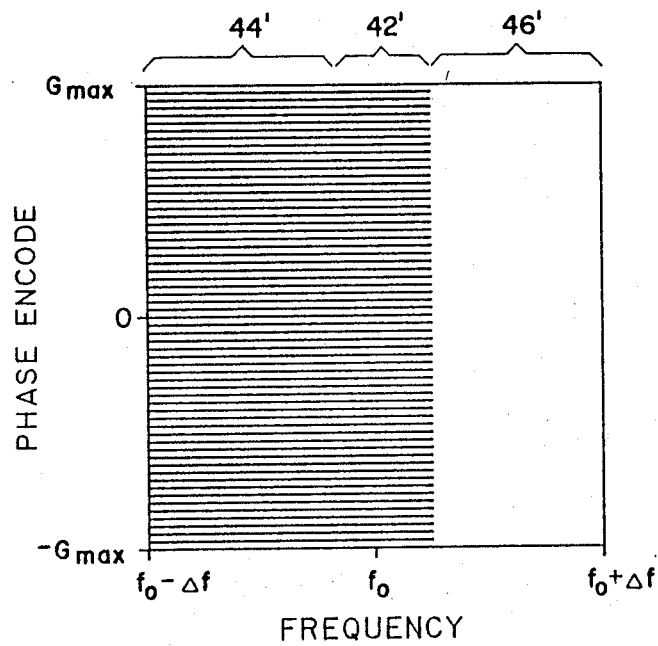

With reference to FIG. 3, a full set of partial views for $-G_{max}$ to $+G_{max}$ may be acquired but which views are incomplete. Specifically, each view includes data in a central frequency region 42' about the $f_o$ or center frequency of the views. Data from a first peripheral region 44', between the central region and one of the $\pm \Delta f$ frequencies is acquired. The peripheral data 46', between the central region and the other of the $\pm \Delta f$ limit of the views is not acquired. The not acquired fraction of the data is again synthesized from the symmetric properties of the magnetic resonance data.

The incomplete data set described above in conjunction with FIGS. 2 or 3 or combinations thereof is stored in the view memory 40. A centering means 50 centers the data. For spin echo or gradient echo imaging, the magnitude of the acquired data is maximum at the center of the data set, i.e. the datum value acquired with the zero or minimum phase encoding angle and with the zero or $f_o$ center frequency. The data within the view memory 40 is shifted such that the center data value whether determined by its large magnitude or otherwise is moved to the memory coordinate corresponding to a zero phase angle and $f_o$ frequency. This may involve shifting data lines up or down or left to right. Any data lines or portion of data lines for which there is no data are filled with zeros.

Optionally, an amplitude correction may be made in the frequency direction to correct for T2 decay. A global phase correction means 52 may perform a phase correction on all the acquired data to compensate or correct for possible T2 decay. However, the same phase correction information is in the phase map discussed below. If the global phase correction is performed, it is preferably of the form:

$$F_{corr}(k_x,k_y) = \frac{F_o^*(0,0)}{|F_o(0,0)|} F_o(k_x,k_y), \quad (1)$$

where $F_o(k_x,k_y)$ is the centered data and $F_o^*(0,0)$ is the complex conjugate of the central datum value of the data set. The acquired data which has been centered and which may also have been T2 amplitude and globally phase corrected is stored in a corrected acquired data memory means 54 or returned to the view memory 40.

A phase map correction generating means 60 reconstructs a phase map equivalent phase correction value set from the acquired incomplete data 42, 44. In one embodiment, all the actually acquired data contributes to the phase correction value set. Alternately, only a portion of the incomplete data set, preferably the central data set portion 42, may contribute to the phase correction value set.

The actually collected data from the first and second regions 42 and 44 or 42', and 44', are filtered with a roll-off filter 62, such as a Hamming filter, to ramp down the data past zero in the first region 42. The filtered data is inverse Fourier transformed by a two dimensional Fourier transform means 64 to form a first or acquired image representation $f_1(x,y)$ which is stored in a first image representation memory means 66. The two dimensional Fourier transform means 64 constructs a first image, e.g. a 256×256 array of complex data values $f_1(x,y)$. The phase correction may be either the complex number phase of the resultant first image or the complex first image normalized to a magnitude of 1.0. The phase correction is the equivalent of a phase map.

In the preferred embodiment, a phase determining means 68 determines the phase of each of the complex data values of the 256×256 first image matrix for storage in a phase correction memory 70, such as a 256×256 memory. The phase values for the phase correction memory 70 may be determined by calculating the arctangent of the real and imaginary parts of each data value. Alternatively, the phase determining means 70 may normalize each first image complex data value such that it becomes a vector of unit length which is stored in the phase memory means 70.

Alternatively, a central data selecting means 80 may select the largest available matrix of data which is centered on the zero phase view, e.g. a 32×256 data matrix centered at (0,0). The remainder of the data values, such as the remainder of a 256×256 array, is loaded with part or all of the actually acquired data from data set 44 and with zeros. A roll-off filter means 82 rolls-off the data values of the selected actually acquired data smoothly to the loaded zeroes. Various roll-off filters may be utilized such as a Hanning filter, a Hamming filter, or the like. The roll-off filter provides a smooth transition from the actually collected data to the surrounding zeros and eliminates any discontinuities which might cause ringing or artifacts. A Fourier transform means 84 transforms the selected data into a phase image $F_p(x,y)$ that is stored in a phase image memory 86. The phase determining means 68 determines the phase of each phase image value to fill the phase correction memory 70.

A symmetric or third data set generating means 90 generates a symmetric third data set corresponding to the unacquired data values, e.g. the values in regions 46, 46', by calculating the complex conjugate for each corresponding data value (kx, ky) of the actually acquired data values, e.g. the values in regions 44, 44'. A filter means 92 ramps up the symmetrized data at a rate that is the complement of the filter 62. A Fourier transform means 94 performs an inverse, two dimensional transform on the complex conjugate data to create a second or symmetric image representation $f_2(x,y)$ for storage in a second image representation memory 96.

A first phase correction means 100 phase corrects the first image representation $f_1(x,y)$ in accordance with the phase information in phase memory means 70. More specifically, a phase correction complex conjugate means 102 calculates the complex conjugate of each value in the phase memory means 70. For example, the complex conjugate of the unit vector $e^{i\phi(x,y)}$ is $e^{-i\phi(x,y)}$. The phase correction means 100 multiplies each (x,y) value of the first image representation by the complex conjugate of the phase value in the phase memory means 70 for the corresponding (x,y) position. In the preferred embodiment, the correction is of the form:

$$f_1(x,y)e^{-i\phi(x,y)} \quad (2).$$

A second phase correction means 104 corrects each data value of the second image representation in accordance with the phase of the corresponding (x,y) point from the phase memory 70. In a preferred embodiment, the second phase correction is of the form:

$$f_2(x,y)e^{i\phi(x,y)} \quad (3).$$

Alternately, the phase of only one of the first and second imagers may be adjusted to match the other, e.g. the phase of the second image $f_2(x,y)$ may be rotated to match the phase of the first image representation $f_1(x,y)$.

In this manner, the first and second correction means 100, 104 perform a phase correction in which the resultant data or image representation is corrected with phase correction data values $\phi(x,y)$ generated from the same data. Utilizing the same data to create the phase correction data protects against the introduction of phase errors which might arise if different data were utilized such as data from a subsequent scan or subsequent echo of the same scan.

An adding means 110 sums the phase corrected first and second image representations in a complex addition process to create a resultant or composite image representation f(x,y) for storage in a resultant image memory 112. The resultant image is, of course, a complex image in which each image data value is a complex number having a real and imaginary part. A display means 114 is operatively connected with the resultant image memory means 112 to display the real component of the resultant image, the imaginary component, the magnitude, or combinations thereof. Other data storage means and image representation enhancement circuitry may, of course, be interconnected with the resultant image memory means 112.

The invention has been described with reference to the preferred embodiments. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiments, the invention is now claimed to be:

1. A method of magnetic resonance imaging comprising:
    (a) exciting magnetic resonance of nuclei in an image region;
    (b) after each excitation of magnetic resonance, causing a magnetic resonance echo during which a magnetic resonance echo signal is generated;
    (c) applying a phase encode gradient between a maximum positive gradient and a maximum negative phase encode gradient such that the resultant magnetic resonance echo signal is phase encoded in accordance with the phase encode gradient;
    (d) quadrature detecting and digitizing the magnetic resonance signal to create a view of digital data values;
    (e) repeating steps (a), (b) (c), and (d) with each of a plurality of phase encode gradients centered around a central phase encode gradient to create centrally encoded data values;
    (f) repeating steps (a), (b), (c), and (d) with each of a plurality of phase encode gradients to create actually collected side data values between the central data values and a view corresponding to one of the maximum positive and negative phase encode gradients;
    (g) generating a phase mapping data set from the centrally encoded and actually collected side data values;
    (h) generating a set of synthesized data values corresponding to non-collected views between the central data values and a view corresponding to the other of the maximum positive and negative phase encode gradients from the collected side data values;
    (i) Fourier transforming the central and the collected side data values to form a first image representation;
    (j) determining complex conjugate values from the phase map and correcting each data value of the first image representation with the complex conjugate of a corresponding value of the phase map to create a phase corrected first image representation;
    (k) Fourier transforming the synthesized data values to create a second image representation;
    (l) phase correcting the second image representation in accordance with corresponding values from the phase mapping data set; and,
    (m) combining the first and second phase corrected image representations.

2. A method of magnetic resonance imaging comprising:
    (a) exciting magnetic resonance in an image region;
    (b) after each excitation of magnetic resonance, causing a magnetic resonance echo during which a magnetic resonance echo signal is generated;
    (c) applying a phase encode gradient such that the resultant magnetic resonance echo signal is phase encoded in accordance with the phase encode gradient;
    (d) collecting a central portion of the magnetic resonance echo signal surrounding a central frequency and a side portion of the magnetic resonance signals between the central portion and one extreme of a resonance signal bandwidth;
    (e) digitizing the collected magnetic resonance echo signal portions to create digital central and side data values;
    (f) repeating steps (a), (b) (c), (d), and (e) with each of a plurality of phase encode gradients;
    (g) generating a phase mapping data set from at least a portion of the central and side data values,
    (h) generating a set of synthesized data values corresponding to frequencies between the central frequency portion and an opposite extreme of the bandwidth from the collected side data values;
    (i) Fourier transforming the central and side data values to form a first image representation;
    (j) determining complex conjugate values of the phase map and correcting each data value of the first image representation with the complex conjugate of a corresponding value of the phase map to create a phase corrected first image representation;
    (k) Fourier transforming the synthesized data values to create a second image representation;
    (l) phase correcting the second image representation in accordance with corresponding values from the phase map; and,
    (m) combining the first and second phase corrected image representations.

3. A method of magnetic resonance imaging comprising:
    acquiring magnetic resonance data including centrally encoded data values and half of the remaining data values;
    generating phase correction values from the acquired magnetic resonance data;
    generating conjugately symmetric data from the acquired magnetic resonance data;
    Fourier transforming the acquired magnetic resonance and conjugately symmetric data;
    phase correcting the Fourier transformed acquired magnetic resonance and conjugately symmetric data in accordance with the phase correction values;
    combining the phase corrected, Fourier transformed data to produce an image representation.

4. The method as set forth in claim 3 wherein the phase map is generated from the centrally encoded data values.

5. The method as set forth in claim 3 wherein the phase map is generated from a combination of the centrally encoded and the half of the remaining data values.

6. A method of magnetic resonance imaging comprising:
generating magnetic resonance data including a first set of centrally encoded data values and a second set of data values which includes half of the remaining data values;
creating a phase correction data value set from data values of the first and second data sets;
generating a conjugately symmetric third data set from the second data set;
Fourier transforming the first, second, and third data value sets;
phase correcting the Fourier transformed first, second, and third data sets in accordance with the phase correction data set;
combining the phase corrected, Fourier transformed data sets to produce an image representation.

7. The method as set forth in claim 6 wherein the step of creating the phase correction data set includes centering, aligning, and combining the data values of the first and second sets.

8. The method as set forth in claim 7 wherein the step of creating the phase correction value set further includes:
filtering data values of the first and second data sets to provide a smooth transition between the data values of the combined first and second data sets and zero data values therearound; and,
performing a two dimensional Fourier transform on the filtered phase correction set of data values and surrounding zeros to form a complex phase data.

9. The method as set forth in claim 8 wherein the complex phase data set generating step further includes normalizing complex data values of the complex phase data set to determine the relative phase.

10. The method as set forth in claim 6 wherein the step of phase correcting the Fourier transformed first and second data sets includes operating on the first and second data sets with complex conjugates of the phase correction data set values; and,
wherein the step of phase correcting the Fourier transformed third data set includes operating on the Fourier transformed third data set with the phase correction data set values.

11. The method as set forth in claim 6 wherein the step of generating the first data set includes generating a plurality of magnetic resonance echoes which are phase encoded around a minimum phase encode gradient, converting the magnetic resonance echo into magnetic resonance echo signals, and digitizing the magnetic resonance echo signals to create the first data set.

12. The method as set forth in claim 11 wherein the step of generating the second set of data values includes generating magnetic resonance echo signals which are phase encoded with phase encode gradients between the central phase encode gradients and one of a positive and negative maximum phase encode gradient.

13. The method as set forth in claim 6 wherein the step of generating the first set of data values includes causing magnetic resonance echoes during each of which magnetic resonance echo signals having a preselected bandwidth and bandwidth center frequency are generated, components of the magnetic resonance echo signal adjacent the central frequency being digitized to form the first set of data values.

14. A method of magnetic resonance imaging comprising:
acquiring an incomplete data set in which a peak datum value is off set in one of a phase encode direction and a frequency direction;
generating a phase correction data set including:
filtering at least a portion of the acquired incomplete data set to create a filtered data set,
completing the filtered data set with zeroes,
inverse Fourier transforming the completed filtered data set to create complex acquired image values;
deriving the phase correction values from the acquired image values;
creating a symmetric data set which completes the incomplete data set by using a conjugate symmetry relationship;
inverse Fourier transforming the symmetric data set to generate complex symmetric image values;
adjusting the relative phase of the acquired and symmetric image values with the phase correction values;
combining the relative phase corrected acquired and symmetric images values to create a complex resultant image; and,
displaying at least one of a real, imaginary, and magnitude component of the resultant image.

15. A magnetic resonance imaging apparatus comprising:
magnetic resonance data means for generating a first set of centrally encoded data values and a second set of data values which includes half of the remaining data values;
a phase correction generating means for generating a phase correction value set from at least a portion of the first and second data value sets;
a conjugate symmetry means for generating a third data set from complex conjugate values of the second data set;
a Fourier transform means for Fourier transforming the first and second data sets to create a first image representation and the third data set to create a second image representation;
a phase correcting means for phase correcting the first and second image representations in accordance with the phase correction value set; and,
a combining means for combining the phase corrected first and second image representations to create a resultant image.

16. A magnetic resonance imaging apparatus comprising:
magnetic resonance data means for acquiring an incomplete magnetic resonance data set;
a phase correction data generating means for generating phase correction data from data of the incomplete data set;
a conjugate symmetry means for generating a symmetric data set from complex conjugate values of the incomplete data set;
a Fourier transform means for Fourier transforming the incomplete and symmetric data sets to create first and second image representations;
a phase correcting means for correcting a relative phase of the first and second image representations in accordance with the phase correction data; and,
a combining means for combining the relative phase corrected first and second image representations to create a resultant image.

17. The apparatus as set forth in claim 16 wherein the magnetic resonance data generating means includes:

means for exciting magnetic resonance of dipoles in an image region;
means for inducing magnetic resonance echoes during which magnetic resonance echo signals are generated;
means for applying magnetic field gradients across the image region for phase and frequency encoding the magnetic resonance signals; and,
an analog-to-digital converter for digitizing the magnetic resonance echo signals to create digital sets of data values.

18. The apparatus as set forth in claim 16 wherein the phase correction data generating means includes:
a filter means for operating on the incomplete data set with a roll-off filter to create a filtered data set;
a Fourier transform means for performing a two dimensional Fourier transform operation on the filtered data set; and,
a phase correction memory means for storing the phase correction data.

19. The apparatus as set forth in claim 16 wherein the phase correcting means includes:
a complex conjugate means for determining complex conjugates of the phase correction data; and,
a multiplying means for multiplying the first and second image representations each by one of the phase correction data and its complex conjugates.

* * * * *